(12) United States Patent
Barwicz et al.

(10) Patent No.: US 8,053,810 B2
(45) Date of Patent: Nov. 8, 2011

(54) STRUCTURES HAVING LATTICE-MISMATCHED SINGLE-CRYSTALLINE SEMICONDUCTOR LAYERS ON THE SAME LITHOGRAPHIC LEVEL AND METHODS OF MANUFACTURING THE SAME

(75) Inventors: Tymon Barwicz, Mount Kisco, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 11/851,858

(22) Filed: Sep. 7, 2007

(65) Prior Publication Data
US 2009/0067463 A1 Mar. 12, 2009

(51) Int. Cl.
*H01L 21/02* (2006.01)
(52) U.S. Cl. .................. 257/190; 257/98; 257/E21.09; 438/479
(58) Field of Classification Search .............. 257/190, 257/189, 191, 98, E21.09; 438/479
See application file for complete search history.

(56) References Cited

U.S. PATENT DOCUMENTS

| | | | |
|---|---|---|---|
| 4,711,514 A * | 12/1987 | Tangonan et al. ............. | 385/130 |
| 5,422,205 A | 6/1995 | Inoue et al. | |
| 5,747,860 A | 5/1998 | Sugiyama et al. | |
| 6,680,495 B2 | 1/2004 | Fitzergald | |
| 6,963,078 B2 * | 11/2005 | Chu ................................ | 257/19 |
| 2005/0186749 A1 | 8/2005 | Sato et al. | |
| 2007/0015344 A1 | 1/2007 | Mears et al. | |
| 2007/0042572 A1 | 2/2007 | Bauer | |
| 2007/0104410 A1 * | 5/2007 | Ahn et al. ...................... | 385/14 |
| 2007/0181977 A1 | 8/2007 | Lochtefeld et al. | |
| 2008/0272391 A1 * | 11/2008 | Kapur et al. .................. | 257/103 |

OTHER PUBLICATIONS

U.S. Office Action dated Dec. 29, 2010.
U.S. Office Action dated Aug. 20, 2010.
Notice of Allowance dated Mar. 28, 2011.

* cited by examiner

*Primary Examiner* — Zandra Smith
*Assistant Examiner* — Jamie C Niesz
(74) *Attorney, Agent, or Firm* — Scully, Scott, Murphy & Presser, PC; Vazken Alexanian

(57) ABSTRACT

A semiconductor substrate containing a single crystalline group IV semiconductor is provided. A single crystalline lattice mismatched group IV semiconductor alloy layer is epitaxially grown on a portion of the semiconductor layer, while another portion of the semiconductor layer is masked. The composition of the lattice mismatched group IV semiconductor alloy layer is tuned to substantially match the lattice constant of a single crystalline compound semiconductor layer, which is subsequently epitaxially grown on the single crystalline lattice mismatched group IV semiconductor alloy layer. Thus, a structure having both the group IV semiconductor layer and the single crystalline compound semiconductor layer is provided on the same semiconductor substrate. Group IV semiconductor devices, such as silicon devices, and compound semiconductor devices, such as GaAs devices having a laser emitting capability, may be formed on the on the same lithographic level of the semiconductor substrate.

7 Claims, 10 Drawing Sheets

STRUCTURES HAVING LATTICE-MISMATCHED SINGLE-CRYSTALLINE SEMICONDUCTOR LAYERS ON THE SAME LITHOGRAPHIC LEVEL AND METHODS OF MANUFACTURING THE SAME

FIELD OF THE INVENTION

The present invention relates to semiconductor structures, and particularly to semiconductor structures having lattice mismatched semiconductor layers on the same lithographic level and methods of manufacturing the same.

BACKGROUND OF THE INVENTION

Group IV element based semiconductor devices, e.g., silicon and/or germanium based semiconductor devices, are commonly used in the semiconductor industry to form semiconductor chips in part due to availability of group IV element semiconductor substrates. Particularly, silicon based substrates containing silicon, silicon germanium alloy, or silicon carbon alloy are commonly available in semiconductor industry at a low cost. In the case of silicon substrates, wafers having a diameter of 300 mm are commonly used in mass manufacturing. Thus, group IV element based semiconductor devices, and particularly, silicon based devices, formed on silicon containing substrates form a majority of semiconductor components utilized in semiconductor chips.

A compound semiconductor is a semiconductor comprising elements from two or more different groups of the periodic table. Compound semiconductors may be binary, ternary, or quaternary, i.e., may have two, three, or four distinct elements. Exemplary III-V binary compound semiconductors include AlN, AlP, AlAs, GaN, GaP, GaAs, InP, InAs, InSb, etc. Exemplary II-VI compounds include ZnS, ZnSe, ZnTe, CdTe, HgTe, etc. Exemplary ternary compound semiconductors include AlInGaP, AlGaAs, InGaN, and CdHgTe. Exemplary quaternary compound semiconductors include InGaAsP.

Semiconductor devices formed from compound semiconductors may offer performance advantages over silicon based semiconductor devices. For example, GaAs has a higher saturated electron velocity and higher electron mobility than silicon, enabling a higher device operation frequency. Also, GaAs devices in general have higher breakdown voltages and generate less noise during a high frequency operation than silicon based devices of comparable dimensions. Further, the band structure of GaAs contains a direct band gap between the conduction band and the valence band, enabling emission of light. For the above reasons, GaAs circuitry is employed in communication devices, microwave devices, and radar systems. Likewise, other compound semiconductors offer distinct advantages over silicon for some semiconductor applications.

In general, compound semiconductors and/or semiconductor devices formed therefrom also have some disadvantages compared with group IV semiconductor elements. For example, mechanical strength of compound semiconductors tends to be inferior to that of group IV semiconductor elements, especially that of silicon. Also, compound semiconductor substrates are harder to manufacture than group IV semiconductor element substrates, especially silicon substrates. This is because silicon is highly abundant on earth as silicates, while the compound semiconductor material tends to be rarer than silicates. Further, stable oxides of compound semiconductors are rare while silicon dioxide may be readily formed and serves as a stable dielectric material.

Therefore, integration of a compound semiconductor material in a group IV semi-conductor element substrate to form group IV element based semiconductor devices and compound semiconductor devices to utilize their respective advantages is desired. However, integration of a single crystalline compound semiconductor material with a single crystalline group IV semiconductor element has proved to be challenging since compound semiconductors are in general formed by processing methods that are uncommon with standard semiconductor processing technologies. Further, due to lattice mismatch between group IV semiconductor elements and compound semiconductors, formation of a single crystalline compound semiconductor layer on a single crystalline group IV semiconductor element containing substrate typically involves bonding of two semiconductor materials.

Prior art methods of integrating a compound semiconductor material into a group IV semiconductor element substrate by growing a thick buffer layer on a group IV semiconductor element substrate, followed by deposition of a compound semiconductor layer, have the disadvantage of requiring a thick epitaxial growth of buffer layers. Further, only the compound semiconductor layer is exposed on the top of the substrate after deposition of the compound semiconductor layer, thus making the portion of the group IV semiconductor element underneath the compound semiconductor layer inaccessible for further processing. This approach is also very inconvenient for semiconductor devices employing both a compound semiconductor material and a group IV semiconductor material simultaneously.

In view of the above, there is a need to provide a semiconductor structure having a group IV semiconductor material and a compound semiconductor material in proximity of each other on the same lithographic level.

In addition, there exists a need for a semiconductor structure having lattice mismatched semiconductor layers, e.g., a group IV semiconductor element layer and a compound semiconductor layer, on the same lithographic level and methods of manufacturing the same.

Further, there exists a need for a semiconductor structure formed on a silicon substrate and having an exposed group IV semiconductor element layer for forming group IV semiconductor element based devices and an exposed compound semiconductor layer for forming compound semiconductor devices at the same lithographic level and methods of manufacturing the same in an economical manner

SUMMARY OF THE INVENTION

The present invention addresses the needs described above by providing structures and fabrication methods for a single crystalline group IV semiconductor layer and a single crystalline semiconductor layer that is lattice mismatched to, i.e., have a different lattice parameter than, the single crystalline group IV semiconductor layer located on the same lithographic level of the same substrate. Preferably, the lattice mismatched single crystalline semiconductor layer comprises a single crystalline compound semiconductor.

According to the present invention, a semiconductor substrate containing a single crystalline group IV semiconductor is provided. A single crystalline lattice mismatched group IV semiconductor alloy layer is epitaxially grown on a portion of the semiconductor layer, while another portion of the semiconductor layer is masked. The composition of a top portion of the lattice mismatched group IV semiconductor alloy layer is tuned to substantially match the lattice constant of a single crystalline compound semiconductor layer, which is subsequently epitaxially grown on the single crystalline lattice mismatched group IV semiconductor alloy layer. Thus, a structure having both the group IV semiconductor layer and the single crystalline compound semiconductor layer is provided on the same semiconductor substrate. Group IV semiconductor devices, such as silicon devices, and compound semiconductor devices, such as GaAs devices having a laser emitting capability, may be formed on the on the same lithographic level of the semiconductor substrate.

According to an aspect of the present invention, a semiconductor structure is provided, which comprises:

a handle substrate, a buried insulator layer abutting the handle substrate;

at least one single crystalline group IV semiconductor structure having a first lattice constant, abutting the buried insulator layer, and comprising a material selected from silicon, germanium, carbon and an alloy thereof;

a single crystalline lattice mismatched group IV semiconductor alloy layer located on the buried insulator layer and containing a top portion having a third lattice constant, wherein the second lattice constant is between the first lattice constant and the third lattice constant; and a stack of single crystalline compound semiconductor layers.

The stack of single crystalline compound semiconductor layers may contain:

a first single crystalline compound semiconductor layer abutting the single crystalline lattice mismatched group IV semiconductor alloy layer and having substantially the same lattice constant as the second lattice constant;

a second single crystalline compound semiconductor layer abutting and epitaxially aligned to the first single crystalline compound semiconductor layer; and a third single crystalline compound semiconductor layer abutting and epitaxially aligned to the second single crystalline compound semiconductor layer.

The at least one single crystalline group IV semiconductor structure may comprise a wave guide.

The waveguide may have an increasing cross-sectional area with distance from the stack up to a first distance, wherein the distance is the magnitude of the shortest vector of all vectors connecting a given point within the wave guide and any of the points within the stack, and the cross-sectional area is measured in the plane perpendicular to the shortest vector.

The semiconductor structure may further comprise a near-infrared transparent layer abutting the stack and the wave guide.

The second single crystalline compound semiconductor layer may comprise a material having a direct band gap and is capable of amplifying or emitting a laser light.

The first single crystalline compound semiconductor layer and the third single crystalline compound semiconductor layer may comprise $GaAs_{1-x}P_x$ and the second single crystalline compound semiconductor layer may comprise $GaAs_{1-y}N_y$, wherein x is in the range from about 0.001 to about 0.999 and y is in the range from about 0.001 to about 0.10.

The first single crystalline compound semiconductor layer may have a length from about 1 μm to about 1 cm and a width from about 200 nm to about 20 μm, wherein the length is greater than the width.

The second single crystalline compound semiconductor layer may have a thickness from about 1 nm to about 100 nm and the first and third single crystalline compound semiconductor layers have a thickness from about 50 nm to about 3 μm.

The range of the vertical height of the second single crystalline compound semiconductor layer may be within the range of the vertical height of the wave guide.

According to another aspect of the present invention, another semiconductor structure is provided, which comprises:

a handle substrate, a buried insulator layer abutting the handle substrate;

a first single crystalline group IV semiconductor layer vertically abutting the buried insulator layer and having a first lattice constant, and comprising a material selected from silicon, germanium, carbon and an alloy thereof;

a second single crystalline group IV semiconductor layer vertically abutting the buried insulator layer, disjoined from the first single crystalline group IV semiconductor layer, and containing having the first lattice constant, and comprising the same material as the first single crystalline group IV semiconductor structure;

a single crystalline lattice mismatched group IV semiconductor alloy layer vertically abutting the second single crystalline group IV semiconductor layer and containing a top portion having a second lattice constant, wherein the second lattice constant is different from the first lattice constant; and at least one single crystalline compound semiconductor layer abutting the single crystalline lattice mismatched group IV semiconductor alloy layer and having a third lattice constant, wherein the second lattice constant is between the first lattice constant and the third lattice constant, wherein a top surface of the first single crystalline group IV semiconductor structure and a top surface of the at least one single crystalline compound semiconductor layer are on the same lithographic level.

In one embodiment, the top surface of the first single crystalline group IV semiconductor structure and the top surface of the at least one single crystalline compound semiconductor layer have a vertical distance less than 1,000 nm.

According to yet another aspect of the present invention, yet another semiconductor structure is provided, which comprises:

a handle substrate, a buried insulator layer abutting the handle substrate;

a single crystalline group IV semiconductor layer vertically abutting the buried insulator layer and having a first lattice constant, and comprising a material selected from silicon, germanium, carbon and an alloy thereof;

a single crystalline lattice mismatched group IV semiconductor alloy layer vertically abutting the buried insulator layer and containing a top portion having a second lattice constant, wherein the second lattice constant is different from the first lattice constant; and at least one single crystalline compound semiconductor layer abutting the single crystalline lattice mismatched group IV semiconductor alloy layer and having a third lattice constant, wherein the second lattice constant is between the first lattice constant and the third lattice constant, wherein a top surface of the first single crystalline group IV semiconductor structure and a top surface of the at least one single crystalline compound semiconductor layer are on the same lithographic level.

In one embodiment, the top surface of the first single crystalline group IV semiconductor structure and the top surface of the at least one single crystalline compound semiconductor layer have a vertical distance less than 1,000 nm.

According to still another aspect of the present invention, a method of forming a semiconductor structure is provided, which comprises:

providing a semiconductor-on-insulator layer having a single crystalline group IV semiconductor layer and having a first lattice constant, wherein the single crystalline group IV semiconductor layer comprises a material selected from silicon, germanium, carbon and an alloy thereof;

forming at least one isolation trench in the single crystalline group IV semiconductor layer and forming a first region and a second region out of the remaining portions of the single crystalline group IV semiconductor layer, wherein the first and second regions are separated by the at least one isolation trench;

masking the first region with an inorganic masking layer or a near-infrared wavelength transparent layer;

forming a single crystalline lattice mismatched group IV semiconductor alloy layer abutting the second region and containing a top portion having a second lattice constant, wherein the second lattice constant is different from the first lattice constant; and epitaxially growing at least one single crystalline compound semiconductor layer abutting the single crystalline lattice mismatched group IV semiconductor alloy layer, wherein the single crystalline compound semiconductor layer has a third lattice constant, wherein said second lattice constant is between the first lattice constant and the third lattice constant.

In an embodiment, the forming of the single crystalline group IV semiconductor alloy may comprise:

forming a group IV alloy region directly on the second region, wherein the group IV alloy region comprises a different group IV element from the element of the single crystalline group IV semiconductor layer; and annealing the group IV alloy region and the second region to diffuse the compositional interface between the said another group IV region and said second region to form a single alloyed region with either graded or uniform composition, which constitutes said single crystalline group IV semiconductor alloy.

In another embodiment, the forming of the single crystalline lattice mismatched group IV semiconductor alloy layer may comprise selective epitaxial deposition of a single crystalline lattice mismatched group IV semiconductor alloy layer directly on the second portion, while the single crystalline lattice mismatched group IV semiconductor alloy layer does not substantially grow over the inorganic masking layer or the near-infrared wavelength transparent layer.

In yet another embodiment, the forming of the single crystalline lattice mismatched group IV semiconductor alloy layer may comprise:

non-selective epitaxial deposition of a single crystalline lattice mismatched group IV semiconductor alloy layer directly on the second portion, while forming a non-single crystalline group IV semiconductor alloy on the inorganic masking layer or the near-infrared wavelength transparent layer; and removing the non-single crystalline group IV semiconductor alloy from above the inorganic masking layer or the near-infrared wavelength transparent layer.

The second region may be thinned prior to forming of the single crystalline lattice mismatched group IV semiconductor alloy layer.

At least one single crystalline group IV semiconductor structure may be formed out of the first region. The at least one single crystalline group IV semiconductor structure may be a wave guide.

The wave guide may have an increasing cross-sectional area with distance from the stack up to a first distance, wherein the distance is the magnitude of the shortest vector of all vectors connecting a given point within the wave guide and any of the points within the stack, and the cross-sectional area is measured in the plane perpendicular to the shortest vector.

The epitaxially growing of at least one single crystalline compound semiconductor layer may comprise:

epitaxially growing a first single crystalline compound semiconductor layer having the third lattice constant directly on the single crystalline lattice mismatched group IV semiconductor alloy layer;

epitaxially growing a second single crystalline compound semiconductor layer directly on the first single crystalline compound semiconductor layer; and epitaxially growing a third single crystalline compound semiconductor layer directly on second single crystalline compound semiconductor layer.

BRIEF DESCRIPTION OF THE DRAWINGS

FIG. 5A is a top-down view; FIG. 5B is a vertical cross-sectional view along the plane B-B'; and FIG. 5C is a vertical cross-sectional view along the plane C-C'.

DETAILED DESCRIPTION OF THE INVENTION

Figure 1A:
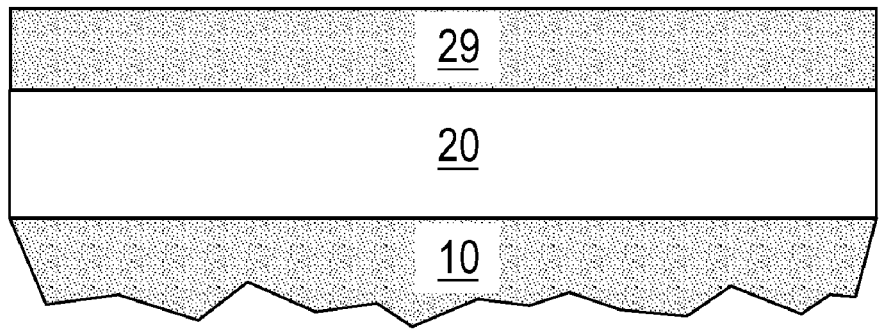
FIGS. 1A-1H show vertical cross-sectional views of a first exemplary semiconductor structure at various stages of manufacturing.

As stated above, the present invention relates to semiconductor structures having lattice mismatched semiconductor layers on the same lithographic level and methods of manufacturing the same, which are now described in detail with accompanying figures. It is noted that like and corresponding elements are referred to by like reference numerals.

The present invention enables structures and methods for multiple single crystalline semiconductor layers having different lattice constants on the same lithographic level of the same semiconductor substrate. A preferred embodiment of the present invention in which a group IV semiconductor layer and a single crystalline compound semiconductor layers having different lattice constants are described herein. Further, a specific exemplary structure is described, which contains a stack of single crystalline compound semiconductor layers capable of generating or amplifying a laser light and at least one single crystalline group IV semiconductor structure capable of guiding the laser light. One skilled in the art may derive other useful structures from the structures described herein.

Referring to FIG. 1A, a first exemplary structure according to a first embodiment of the present invention comprises a semiconductor-on-insulator substrate comprising a handle substrate 10, a buried insulator layer 20, and a single crystalline group IV semiconductor layer 29. The handle substrate 10 comprises a semiconductor material such as silicon, silicon carbon alloy, silicon germanium alloy, silicon carbon germanium alloy, GaAs, InAs, another III-V compound semiconductor material, or one of II-IV compound semiconductors. Preferably, the handle substrate 10 is a silicon substrate.

The buried insulator layer 20 may comprise a dielectric material such as an oxide or a nitride. Preferably, the buried insulator layer 20 comprises silicon oxide.

The single crystalline group IV semiconductor layer 29 comprises silicon, germanium, carbon, or an alloy thereof. For example, the single crystalline group IV semiconductor layer 29 may be a single crystalline silicon layer, a single crystalline germanium layer, a single crystalline silicon germanium alloy layer that may, or may not, have a graded composition, a single crystalline silicon carbon alloy layer, or a single crystalline silicon germanium carbon alloy layer. The thickness of the single crystalline group IV semiconductor layer 29 may be from about 100 nm to about 6 µm. The single crystalline group IV semiconductor layer 29 may be intrinsic or may be doped with electrical dopants such as B, Ga, In, P, As, and Sb. The single crystalline group IV semiconductor layer 29 has a first lattice constant. For example, the first lattice constant is substantially the same as 0.543095 nm at 300K in case of a silicon layer, or is substantially the same as 0.564613 nm at 300K in case of a germanium layer. Other values of the first lattice constant may be obtained by suitable alloying of the group IV elements.

Figure 1B:
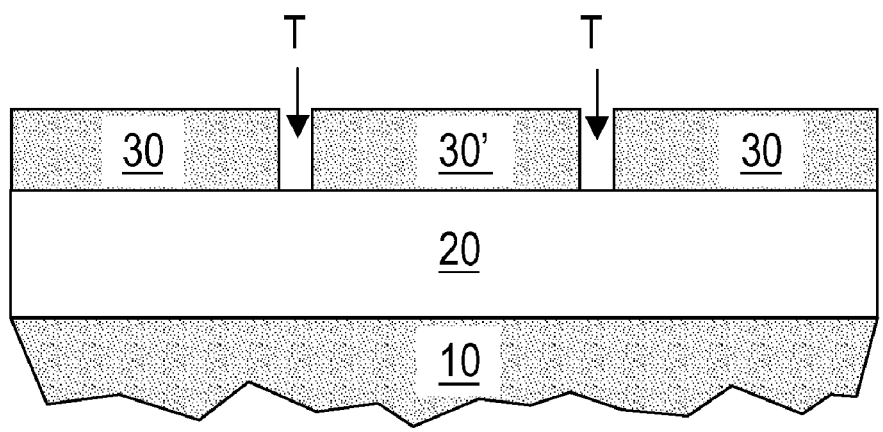

Referring to FIG. 1B, the single crystalline group IV semiconductor layer 29 is lithographically patterned and etched to form at least one isolation trench T in the single crystalline group IV semiconductor layer 29. Methods of lithographic patterning and etching of the at least one isolation trench T are well known in the art. A first region 30 and a second region 30' are formed out of the remaining portions of the single crystalline group IV semiconductor layer 29 after the formation of the at least one isolation trench T. The first region 30 and the second region 30' are separated by the at least one isolation trench T. The first region 30 and the second region 30' have the first lattice constant.

Figure 1C:
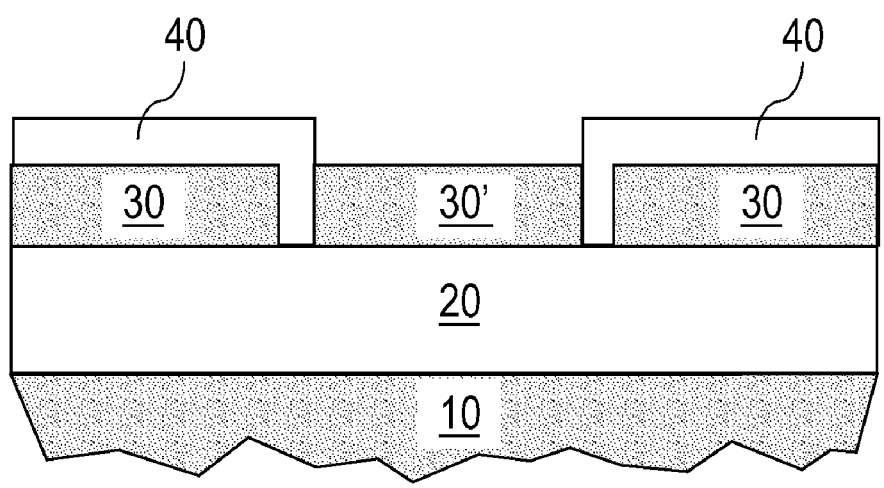

Referring to FIG. 1C, the first region 30 is masked with an inorganic masking layer 40. This may be effected by depositing an inorganic masking layer 40 over the first and second regions (30, 30') and lithographically patterning and etching the portion of the inorganic masking layer 40 over the second region 30', while protecting the portion of the inorganic masking layer 40 over the first region 30 with a remaining portion of a photoresist (not shown). The inorganic masking layer 40 may comprise any inorganic material that may withstand subsequent high temperature processing conditions such as epitaxy of semiconductor materials. The inorganic material layer 40 may comprise a dielectric material, a semiconductor material, a metal, or a combination thereof. The inorganic masking layer 40 protects the first region 30 during subsequent processing. The inorganic masking material may comprise a dielectric material on which a semiconductor is not substantially deposited during a selective epitaxy. For example, the inorganic masking layer 40 may comprise silicon oxide or silicon nitride. The thickness of the inorganic masking layer 40 may be from about 10 nm to about 1 µm.

The overlay between the edge of the remaining portion of the inorganic masking layer 40 and the second region 30' may vary. In one embodiment, the edge of the remaining portion of the inorganic masking layer 40 may substantially coincide with the edge of the second region 30'. In another embodiment, the edge of the remaining portion of the inorganic masking layer 40 may be located over a portion of the second region 30'. In yet another embodiment, the edge of the remaining portion of the inorganic masking layer 40 may be located within the at least one isolation trench T. In embodiments employing selective deposition, i.e., growth of material only from semiconductor surfaces while growth of semiconductor material from dielectric surfaces is suppressed, the overlay of the edge of the remaining portion of the inorganic masking layer 40 with the second region 30' does not play any significant role. In embodiments employing non-selective deposition, i.e., growth of material from both semiconductor surfaces and dielectric surfaces, it is preferred the edge of the remaining portion of the inorganic masking layer 40 contacts the second region 30'.

Figure 1D:
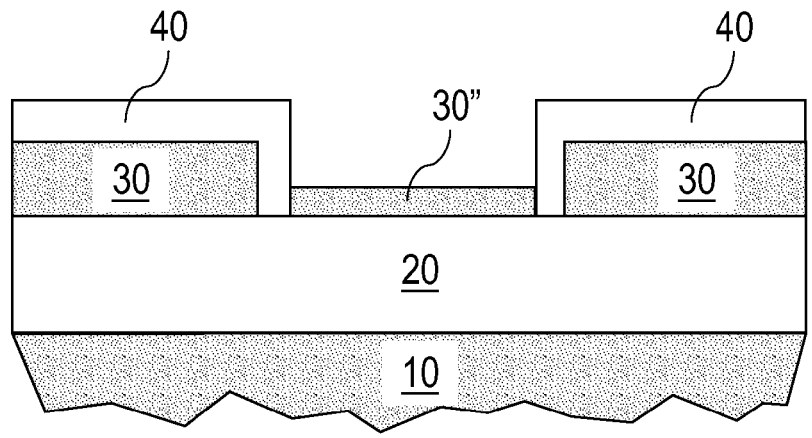

Referring to FIG. 1D, the second region 30' is thinned to form a thinned second region 30". The thinning of the second region 30' maybe accomplished, for example, by a reactive ion etch process that is selective to the inorganic masking layer 40. The thickness of the thinned second region 30" may be from about 5 nm to about 5 µm, and preferably from about 10 nm to about 300 nm.

Figure 1E:
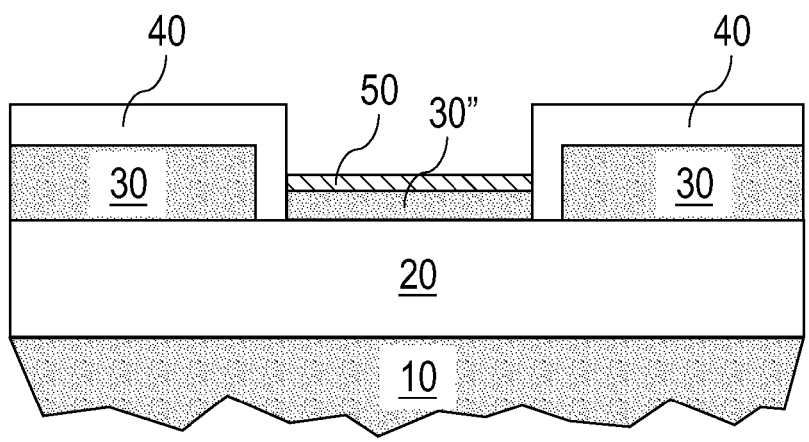

Referring to FIG. 1E, a single crystalline lattice mismatched group IV semiconductor alloy layer 50 is epitaxially grown directly on the thinned second region 30". The single crystalline lattice mismatched group IV semiconductor alloy layer 50 comprises at least two group IV elements. The single crystalline lattice mismatched group IV semiconductor alloy layer 50 may comprise at least two elements selected from the group consisting of carbon, silicon, and germanium. For example, the single crystalline lattice mismatched group IV semiconductor alloy layer 50 may comprise a silicon germanium alloy. The thickness of the single crystalline lattice mismatched group IV semiconductor alloy layer 50 may be from about 5 nm to about 4 µm, and preferably from about 50 nm to about 3 µm.

A top portion of the single crystalline lattice mismatched group IV semiconductor alloy layer 50 has a second lattice constant that is different from the first lattice constant of the first region 30 and the thinned second region 30". This may be effected by employing a graded layer, in which the composition and lattice parameter changes gradually, for the single crystalline lattice mismatched group IV semiconductor alloy layer 50. Thus, the single crystalline lattice mismatched group IV semiconductor alloy layer 50 is "lattice mismatched" over the first lattice constant of the first region 30. However, the degree of lattice match is such that the single crystalline lattice mismatched group IV semiconductor alloy layer 50 is epitaxially aligned to the thinned second region 30". The second lattice constant substantially matches the lattice constant of a compound semiconductor material to be subsequently formed on the single crystalline lattice mismatched group IV semiconductor alloy layer 50. While the present invention is described with one single crystalline lattice mismatched group IV semiconductor alloy layer 50, a stack of multiple single crystalline lattice mismatched group IV semiconductor alloy layers having different lattice parameters amongst one another is explicitly contemplated herein.

The single crystalline lattice mismatched group IV semiconductor alloy layer 50 may be grown by a selective epitaxy in which the material of the single crystalline lattice mismatched group IV semiconductor alloy layer 50 is grown on the thinned second region 30" but no or little material grows on the inorganic masking layer 40. In general, growth of a crystalline semiconductor material on an amorphous insulator surface is inhibited in a selective epitaxy process.

Alternatively, the single crystalline lattice mismatched group IV semiconductor alloy layer 50 may be grown by a non-selective epitaxy in which the material of the single crystalline lattice mismatched group IV semiconductor alloy layer 50 is grown on the thinned second region 30", while a polycrystalline or amorphous group IV semiconductor alloy layer (not shown) having substantially the same composition as the single crystalline lattice mismatched group IV semiconductor alloy layer 50 is grown on the inorganic masking layer 40. In this case, the polycrystalline or amorphous group IV semiconductor alloy layer is removed, for example, by a wet etch, a reactive ion etch, or by planarization. Further, the single crystalline lattice mismatched group IV semiconductor alloy layer 50 may be recessed as necessary to form the structure of FIG. 1E.

Figure 1F:
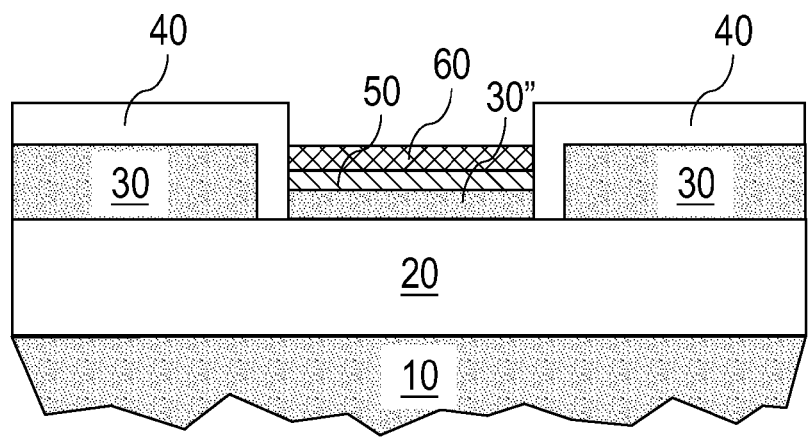

Referring to FIG. 1F, a single crystalline compound semiconductor layer 60 is epitaxially grown directly on the single crystalline lattice mismatched group IV semiconductor alloy layer 50. The lattice constant of the single crystalline compound semiconductor layer 60 is substantially the same as the second lattice constant of the single crystalline lattice mismatched group IV semiconductor alloy layer 50. The single crystalline compound semiconductor layer 60 may comprise GaAs, InAs, InP, another III-V compound semiconductor alloy, or a II-V compound semiconductor alloy that may be epitaxially grown on the single crystalline lattice mismatched group IV semiconductor alloy layer 50. For example, the single crystalline compound semiconductor layer 60 may comprise $GaAs_{1-x}P_x$ with the value of x in the range from about 0.001 to about 0.999. The thickness of the a single crystalline compound semiconductor layer 60 may be from about 5 nm to about 4 µm, and preferably from about 50 nm to about 3 µm.

The top surface of the single crystalline compound semiconductor layer 60 may be located above, at substantially the same height as, or below the top surface of the first region 30. Preferably, the top surface of the single crystalline compound semiconductor layer 60 is located substantially at substantially the same height as the top surface of the first region 30. Presence of two regions having small enough differences in the height such that pattern definition on both regions is possible in the same lithographic process is herein referred to be on the same lithographic level. In general, the permissible height variation between the two regions to be considered as the same lithographic level varies depending on details of lithographic tools and the photoresist employed in the lithographic processes. For example, the depth of focus of the lithographic system is a measure of the permissible height variation. U.S. Pat. No. 5,422,205 to Inoue et al., the contents of which are herein incorporated by reference, describes the relationship between the depth of focus and other lithographic process parameters. For MUV and DUV lithographic systems, the depth of focus is from about 100 nm to about 1,000 nm, and typically from about 200 nm to about 700 nm.

Preferably, the top surface of the single crystalline compound semiconductor layer 60 and the top surface of the first region 30 are within the same lithographic level in the first exemplary structure.

In the same manner as the formation of the single crystalline lattice mismatched group IV semiconductor alloy layer 50 described above, the single crystalline compound semiconductor layer 60 may be grown by a selective epitaxy in which the material of the single crystalline compound semiconductor layer 60 is grown on the single crystalline lattice mismatched group IV semiconductor alloy layer 50 but no or little material grows on the inorganic masking layer 40.

Alternatively, the single crystalline compound semiconductor layer 60 may be grown by a non-selective epitaxy in which the material of the single crystalline compound semiconductor layer 60 is grown on the single crystalline lattice mismatched group IV semiconductor alloy layer 50, while a polycrystalline or amorphous compound semiconductor layer (not shown) having substantially the same composition as the single crystalline compound semiconductor layer 60 is grown on the inorganic masking layer 40. In this case, the polycrystalline or amorphous compound semiconductor layer is removed, for example, by a reactive ion etch or by planarization. Further, the single crystalline compound semiconductor layer 60 may be recessed as necessary.

Figure 1G:
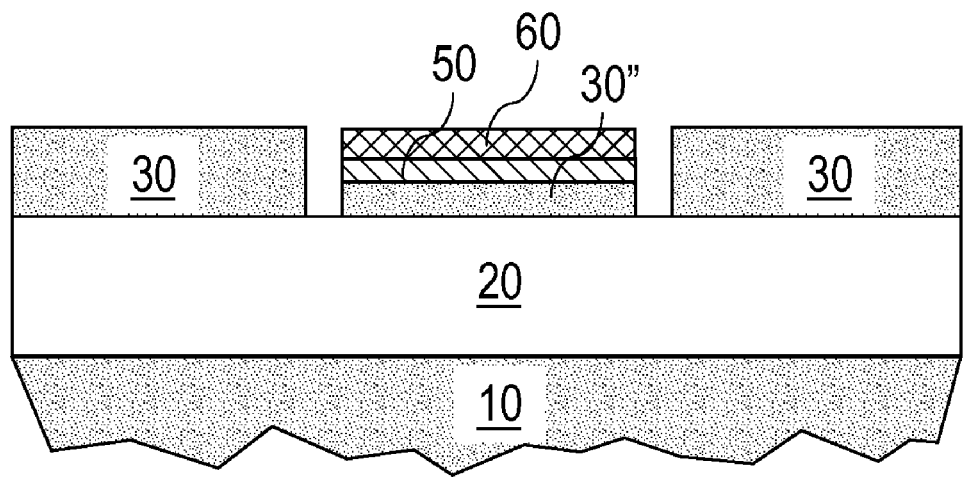

Referring to FIG. 1G, the inorganic masking layer 40 may be optionally removed. Semiconductor device structures may be formed in the first region 30 and/or the single crystalline compound semiconductor layer 60.

Figure 1H:
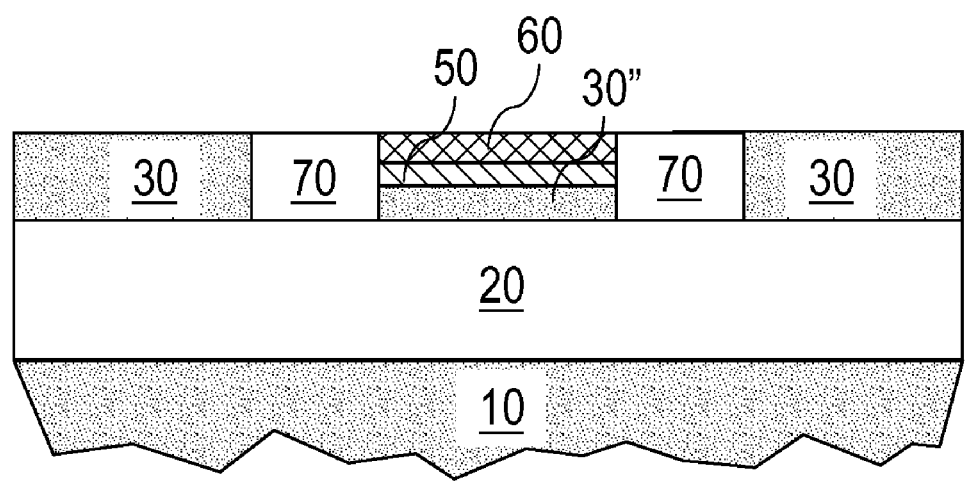

Referring to FIG. 1H, shallow trench isolation structures 70 may be optionally formed between the first region 30 and the stack of the single crystalline compound semiconductor layer 60, the single crystalline lattice mismatched group IV semiconductor alloy layer 50, and the thinned second region 30". Portions of the first region 30 and the stack are etched to form shallow trenches in which the shallow trench isolation structures 70 are formed. Formation of the shallow trench isolation structures 70 is particularly useful in case non-selective epitaxy is employed during the formation of either the single crystalline compound semiconductor layer 60 or the single crystalline lattice mismatched group IV semiconductor alloy layer 50 since non-selective epitaxy tends to leave some polycrystalline or amorphous material on the sidewalls of the inorganic masking layer 40. Such crystalline imperfections are removed during the formation of the shallow trench isolation structures 70. Additional semiconductor device structures may be formed in the first region 30 and/or the single crystalline compound semiconductor layer 60.

Figure 2A:
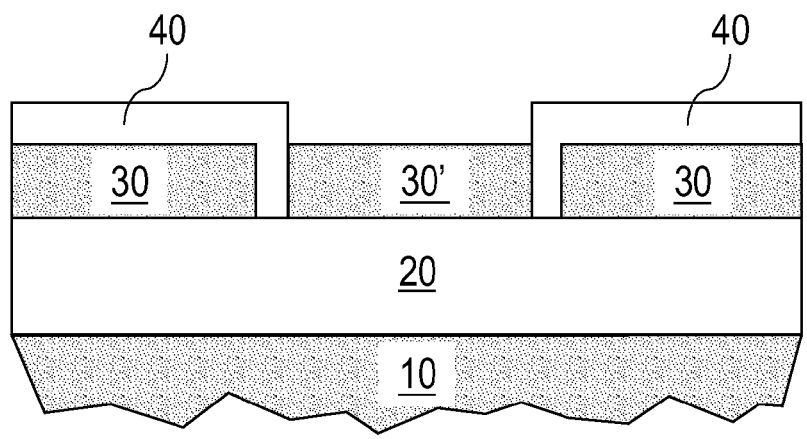
FIGS. 2A-2F show vertical cross-sectional views of a second exemplary semiconductor structure at various stages of manufacturing.

Referring to FIG. 2A, a second exemplary semiconductor structure according to a second embodiment of the present invention is formed by first providing a first exemplary semiconductor structure shown in FIG. 1C.

Figure 2B:
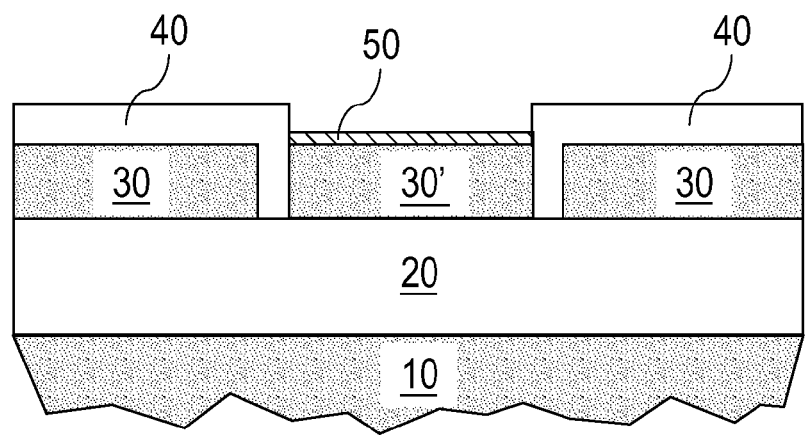

Referring to FIG. 2B, the single crystalline group IV semiconductor layer 50 is epitaxially grown directly on the second region 30' having the original thickness. This is unlike the first embodiment in that the second region 30' is not thinned in the second embodiment. The composition and thickness of the single crystalline lattice mismatched group IV semiconductor alloy layer 50 is the same as in the first embodiment. As in the first embodiment, the single crystalline lattice mismatched group IV semiconductor alloy layer 50 has a second lattice constant that is different from the first lattice constant of the first region 30 and the second region 30'. The second lattice constant substantially matches the lattice constant of a compound semiconductor material to be subsequently formed on the single crystalline lattice mismatched group IV semiconductor alloy layer 50. The same methods for epitaxial growth may be employed for the growth of the single crystalline group IV semiconductor layer 50 on the second region 30' in the second embodiment as the methods for epitaxial growth of the single crystalline group IV semiconductor layer 50 in the first embodiment.

Figure 2C:
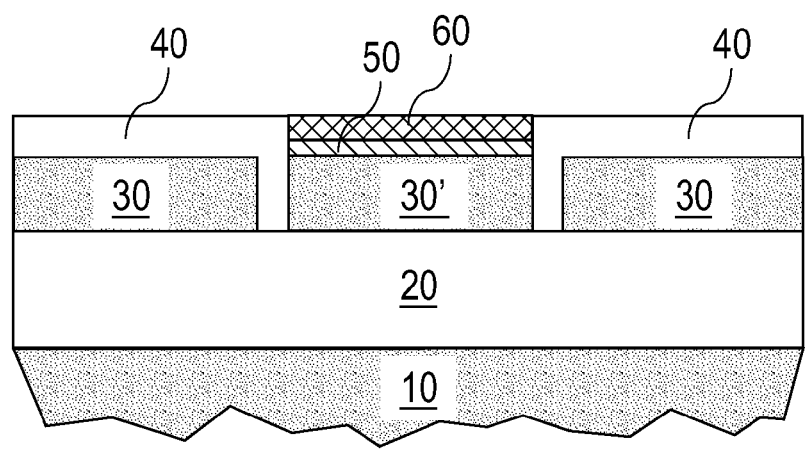

Referring to FIG. 2C, a single crystalline compound semiconductor layer 60 is epitaxially grown directly on the single crystalline lattice mismatched group IV semiconductor alloy layer 50. The composition and thickness of the single crystalline compound semiconductor alloy layer 60 is the same as in the first embodiment. The single crystalline compound semiconductor layer 60 may comprise GaAs, InAs, InP, another III-V compound semiconductor alloy, or a II-V compound semiconductor alloy that may be epitaxially grown on the single crystalline lattice mismatched group IV semiconductor alloy layer 50. For example, the single crystalline compound semiconductor layer 60 may comprise $GaAs_{1-x}P_x$ with the value of x in the range from about 0.001 to about 0.999. The same methods for epitaxial growth may be employed for the growth of the single crystalline compound semiconductor layer 60 on the single crystalline lattice mismatched group IV semiconductor alloy layer 50 in the second embodiment as the methods for epitaxial growth of the single crystalline compound semiconductor layer 60 in the first embodiment. The top surface of the single crystalline compound semiconductor layer 60 may be located above, at the same lithographic level as, or below, the top surface of the inorganic masking layer 40. Further, the top surface of the single crystalline compound semiconductor layer 60 may be located above, at the same lithographic level as, or below, the top surface of the first region 30.

Figure 2D:
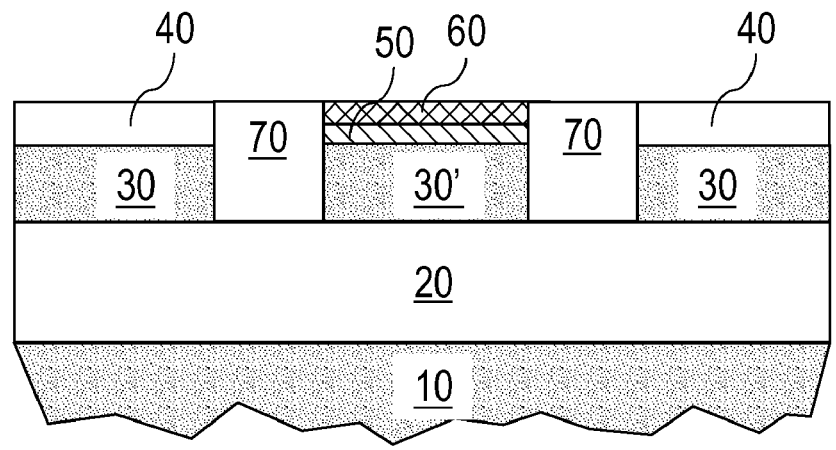

Referring to FIG. 2D, shallow trench isolation structures 70 may be optionally formed between the first region 30 and the stack of the single crystalline compound semiconductor layer 60, the single crystalline lattice mismatched group IV semiconductor alloy layer 50, and the second region 30'. Portions of the first region 30 and the stack are etched to form shallow trenches in which the shallow trench isolation structures 70 are formed. Formation of the shallow trench isolation structures 70 is particularly useful in case non-selective epitaxy is employed in prior processing steps for the same reasons described above. Semiconductor device structures may be formed in the first region 30 and/or the single crystalline compound semiconductor layer 60 at this step.

Figure 2E:
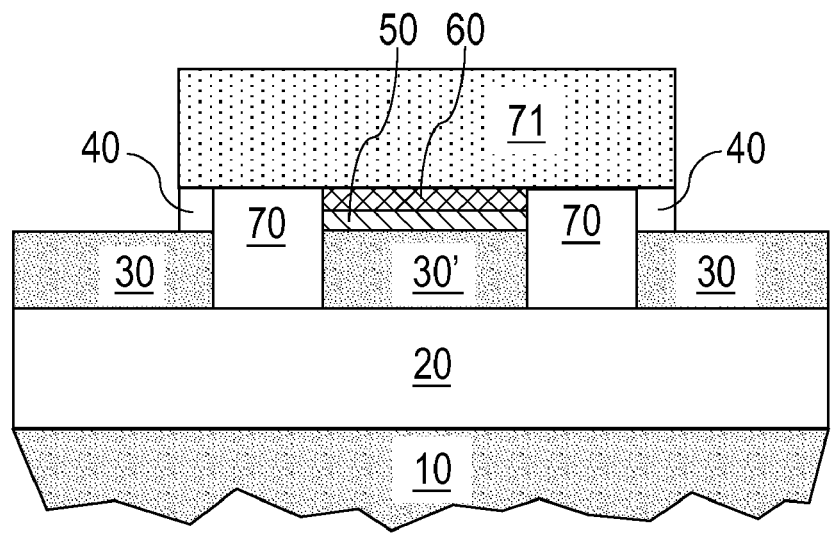

Referring to FIG. 2E, optionally, a photoresist 71 is applied on the surface of the shallow trench isolation 70, inorganic masking layer 40, and the single crystalline compound semiconductor layer 60 and lithographically patterned to cover at least a portion of the single crystalline compound semiconductor layer 60 and to expose at least a portion of the inorganic masking layer 40. The exposed portion of the inorganic masking layer 40 is etched by a reactive ion etch that employs the patterned photoresist 71 as an etch mask.

Figure 2F:
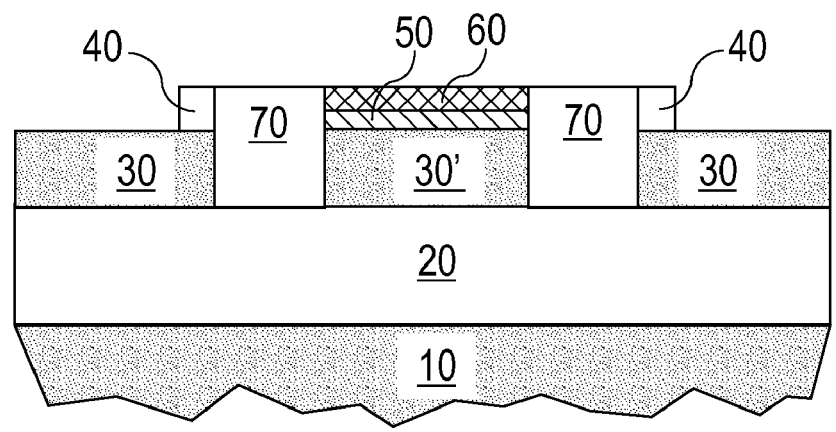

Referring to FIG. 2F, at least a portion of the single crystalline compound semiconductor layer 60 and at least a portion of the first region 30 are exposed. The first region 30 comprises a group IV semiconductor element having a first lattice constant and the single crystalline compound semiconductor layer 60 comprises a compound semiconductor having a second lattice constant. Thus, a semiconductor structure having lattice mismatched semiconductor layers on the same lithographic level is provided. Specifically, a semiconductor structure formed on a handle substrate 10, which may be a silicon substrate, and having an exposed group IV semiconductor element layer, e.g., the exposed portion of the first region 30, for forming group IV semiconductor element based devices, i.e., silicon based devices or germanium based devices, and an exposed compound semiconductor layer, e.g., the exposed portion of the single crystalline compound semiconductor layer 60, for forming compound semiconductor devices at the same lithographic level.

Figure 3A:
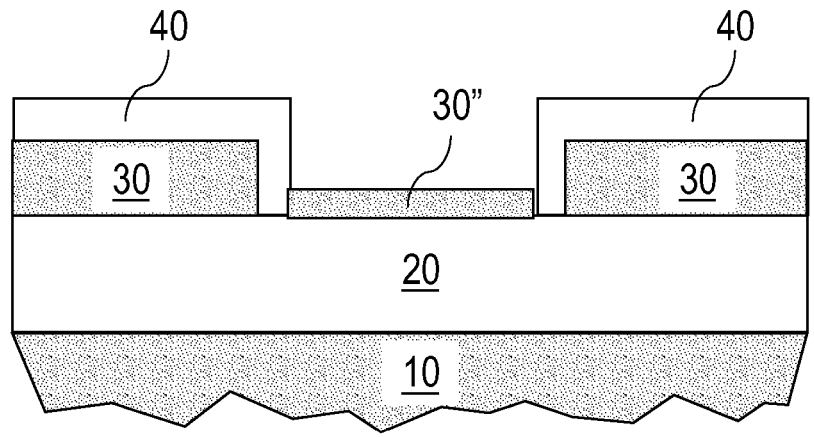
FIGS. 3A-3F show vertical cross-sectional views of a third exemplary semiconductor structure at various stages of manufacturing.

Referring to FIG. 3A, a third exemplary structure according to a third embodiment of the present invention comprises providing a first exemplary structure as shown in FIG. 1D according to the first embodiment.

Figure 3B:
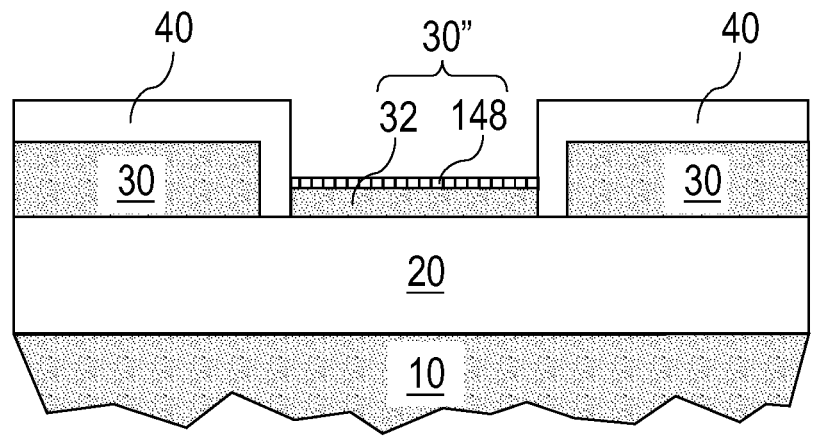

Referring to FIG. 3B, another group IV region 148 is formed on the thinned second region 30". The another group IV region 148 comprises a different material than the single crystalline group IV semiconductor material in the thinned second region 30". For example, in case the first region 30 and the thinned second region 30" comprise silicon, the another group IV region 148 may comprise germanium, a silicon germanium alloy, carbon, a silicon carbon alloy, and/or germanium carbon alloy. In case the first region 30 and the thinned second region 30" comprise germanium, the another group IV region 148 may be silicon, a silicon germanium alloy, carbon, a germanium carbon alloy, and/or a silicon carbon alloy.

Figure 3C:
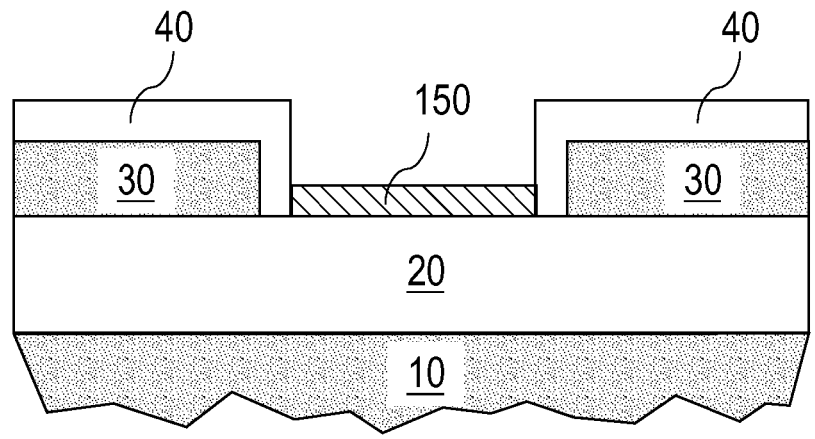

Referring to FIG. 3C, the another group IV region 148 and the thinned second region 30" are annealed to diffuse the another group IV material into the thinned second region 30" to form a graded or uniform second region, which is a single crystalline lattice mismatched group IV semiconductor alloy layer 150 having a second lattice constant that is different from the first lattice constant. The anneal may be a global anneal, such as a furnace anneal or a rapid thermal anneal (RTA), in which the entirety of the third exemplary semiconductor structure is annealed, or alternatively, a local anneal, such as a laser anneal, in which the semiconductor material in the thinned second region 30" is locally annealed without necessarily heating the rest of the third exemplary semiconductor structure to the same temperature. The anneal is typically performed at a high temperature in the range from about 500° C. to about 1,400° C.

Figure 3D:
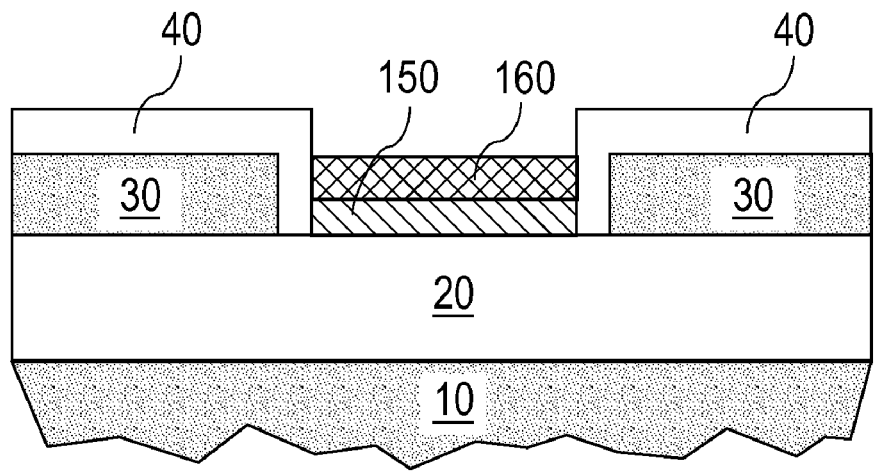

Referring to FIG. 3D, a single crystalline compound semiconductor layer 160 is epitaxially grown directly on the single crystalline lattice mismatched group IV semiconductor alloy layer 150. The composition and thickness of the single crystalline compound semiconductor alloy layer 160 in the third embodiment is the same as the composition and thickness of the single crystalline compound semiconductor alloy layer 60 in the first embodiment. The single crystalline compound semiconductor layer 160 may comprise GaAs, InAs, InP, another III-V compound semiconductor alloy, or a II-V compound semiconductor alloy that may be epitaxially grown on the single crystalline lattice mismatched group IV semiconductor alloy layer 150. For example, the single crystalline compound semiconductor layer 160 may comprise $GaAs_{1-x}P_x$ with the value of x in the range from about 0.001 to about 0.999. The same methods for epitaxial growth may be employed for the growth of the single crystalline compound semiconductor layer 160 on the single crystalline lattice mismatched group IV semiconductor alloy layer 150 in the third embodiment as the methods for epitaxial growth of the single crystalline compound semiconductor layer 60 in the first embodiment. The top surface of the single crystalline compound semiconductor layer 160 may be located above, at the same lithographic level as, or below the top surface of the first region 30. Preferably, the top surface of the single crystalline compound semiconductor layer 160 is located at the same lithographic level as the top surface of top surface of the first region 30.

Figure 3E:
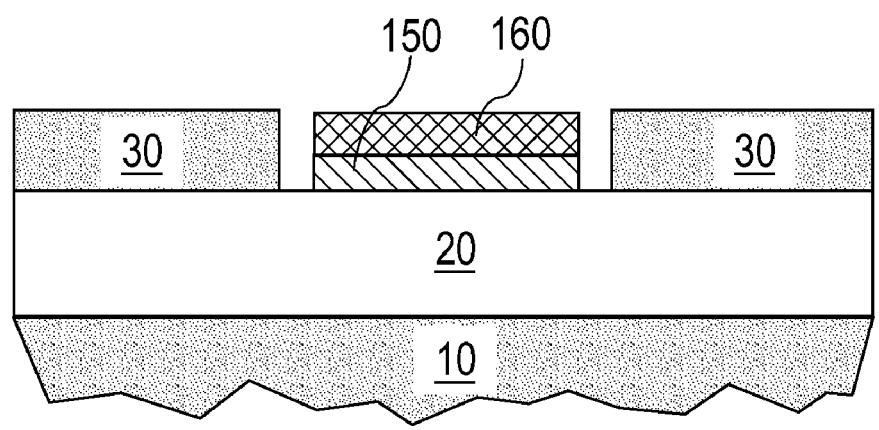

Referring to FIG. 3E, the inorganic masking layer 40 may be optionally removed. Semiconductor device structures may be formed in the first region 30 and/or the single crystalline compound semiconductor layer 160.

Figure 3F:
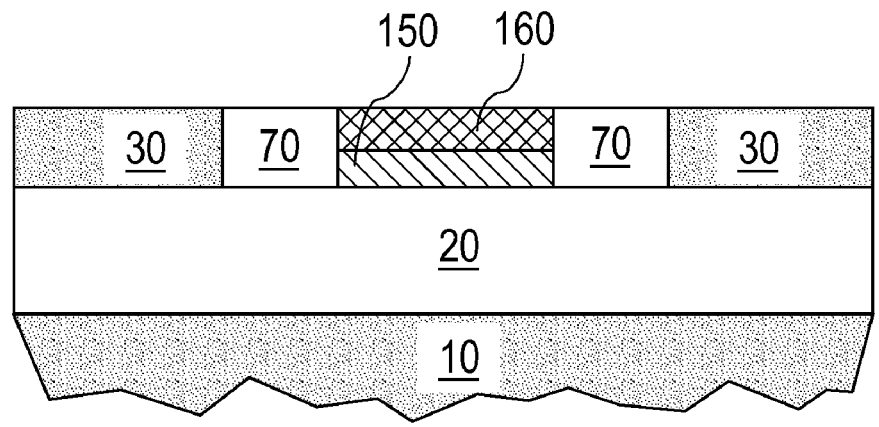

Referring to FIG. 3F, shallow trench isolation structures 70 may be optionally formed between the first region 30 and the stack of the single crystalline compound semiconductor layer 160 and the single crystalline lattice mismatched group IV semiconductor alloy layer 150. Portions of the first region 30 and the stack are etched to form shallow trenches in which the shallow trench isolation structures 70 are formed. Formation of the shallow trench isolation structures 70 is particularly useful in case non-selective epitaxy is employed for the reasons described above. Additional semiconductor device structures may be formed in the first region 30 and/or the single crystalline compound semiconductor layer 160.

Figure 4A:
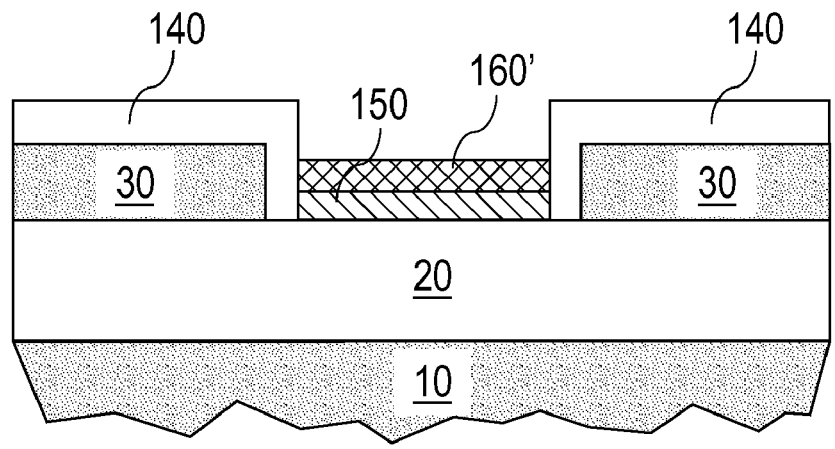
FIGS. 4A-4C show vertical cross-sectional views of a fourth exemplary semiconductor structure at various stages of manufacturing.

Referring to FIG. 4A, a fourth exemplary semiconductor structure according to a fourth embodiment of the present invention is formed by providing be employing the same manufacturing methods as the third exemplary structure as shown in FIG. 3D except that the inorganic masking layer 40 is replaced with a near-infrared wavelength transparent layer 140. Further, due to presence of additional single crystalline compound semiconductor layers in the fourth embodiment, the crystalline compound semiconductor layer 160 in the third embodiment is referred to as a first single crystalline compound semiconductor layer 160' in the fourth embodiment. For example, the first single crystalline compound semiconductor layer 160' may comprise $GaAs_{1-x}P_x$ with the value of x in the range from about 0.001 to about 0.999. The first single crystalline compound semiconductor layer 160' may have a thickness from about 50 nm to about 3 μm.

The near-infrared wavelength transparent layer 140 is transparent in the near-infrared wavelength region of spectral wavelengths, which is from about 800 nm to about 2,400 nm. Non-limiting examples of materials for the near-infrared wavelength transparent layer 140 include silicon oxide, silicon nitride, silicon carbide, aluminum oxide, aluminum nitride, and other dielectric materials. In general, any material having a band gap greater than about 1.5 eV may be employed for the near-infrared wavelength transparent layer 140.

Figure 4B:
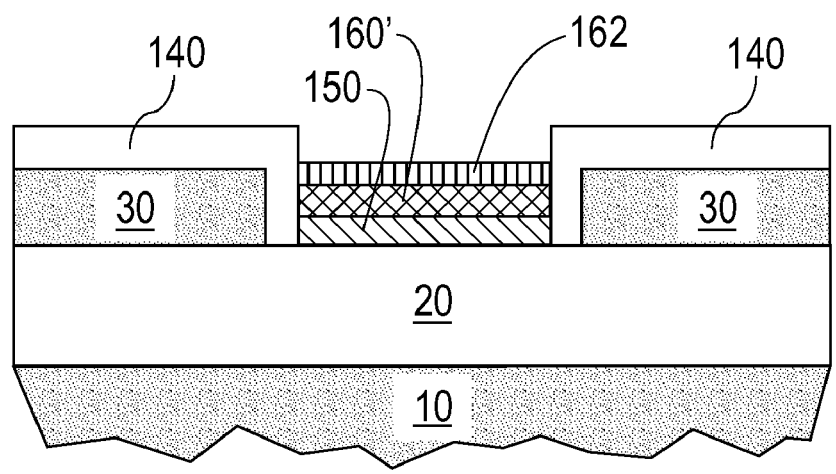

Referring to FIG. 4B, a second single crystalline compound semiconductor layer 162 is epitaxially grown directly on the first single crystalline compound semiconductor layer 160'. The second single crystalline compound semiconductor layer 162 may comprise GaAs, InAs, InP, another III-V compound semiconductor alloy, or a II-V compound semiconductor alloy that may be epitaxially grown on the first single crystalline compound semiconductor layer 160'. Preferably, the composition of the second single crystalline compound semiconductor alloy layer 162 is different from the composition of the first single crystalline compound semiconductor alloy layer 160'. For example, the second single crystalline compound semiconductor layer 162 may comprise $GaAs_{1-y}N_y$ with the value of y in the range from about 0.001 to about 0.10.

The same methods for epitaxial growth may be employed for the growth of the second single crystalline compound semiconductor layer 162 on the first single crystalline compound semiconductor layer 160' as the methods for epitaxial growth of the single crystalline compound semiconductor layer 60 in the first embodiment. The thickness of the second single crystalline compound semiconductor layer 162 may be from about 0.5 nm to about 200 nm. The top surface of the second single crystalline compound semiconductor layer 162 may be located above, at the same lithographic level as, or below the top surface of the first region 30. Preferably, the top surface of the second single crystalline compound semiconductor layer 162 is located at the same level as the top surface of the first region 30.

Figure 4C:
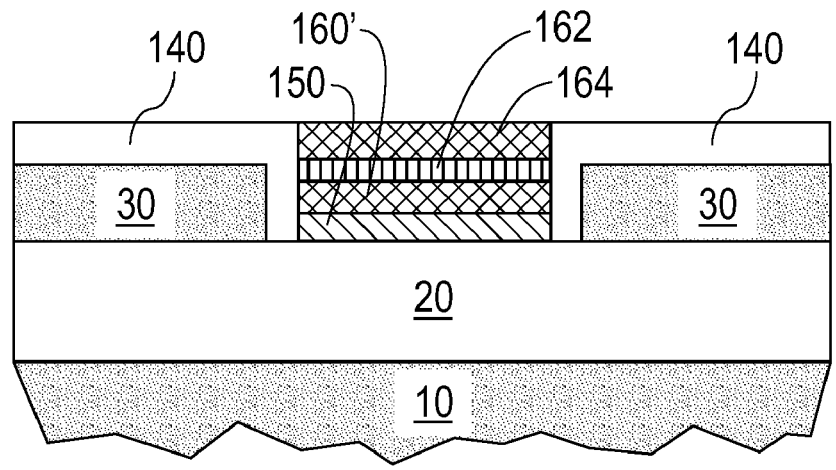

Referring to FIG. 4C, a third single crystalline compound semiconductor layer 164 is epitaxially grown directly on the second single crystalline compound semiconductor layer 162. The third single crystalline compound semiconductor layer 164 may comprise GaAs, InAs, InP, another III-V compound semiconductor alloy, or a II-V compound semiconductor alloy that may be epitaxially grown on the second single crystalline compound semiconductor layer 162. Preferably, the composition of the third single crystalline compound semiconductor alloy layer 164 is different from the composition of the second single crystalline compound semiconductor alloy layer 162. For example, the third single crystalline compound semiconductor layer 164 may comprise $GaAs_{1-x}P_x$ with the value of x in the range from about 0.001 to about 0.999.

The same methods for epitaxial growth may be employed for the growth of the third single crystalline compound semiconductor layer 164 on the second single crystalline compound semiconductor layer 162 as the methods for epitaxial growth of the single crystalline compound semiconductor layer 60 in the first embodiment. The first single crystalline compound semiconductor layer 160' may have a thickness from about 50 nm to about 3 μm. The top surface of the third single crystalline compound semiconductor layer 164 may be located above, at the same lithographic level as, or below the top surface of the first region 30.

It will be appreciated that the layer 162 can be formed of a stack of multiple, alternating thin layers of two single crystalline compound semiconductors of different compositions as to form multiple quantum wells (MQW), which are well known by people skilled in the art.

Figure 5A:
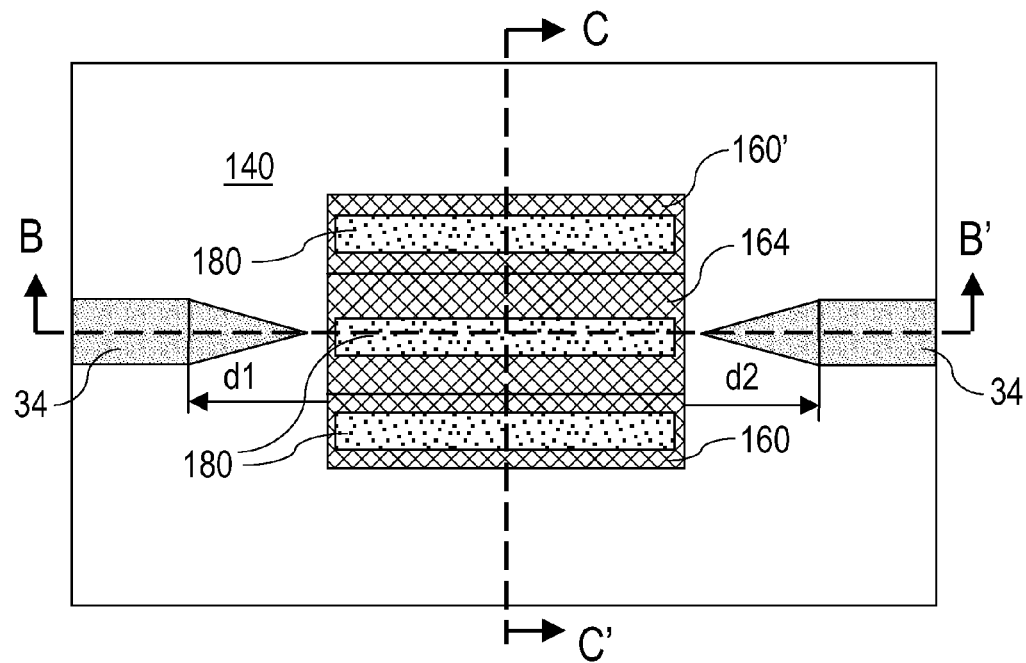
FIGS. 5A-5C show a fifth exemplary semiconductor structure.
Figure 5B:
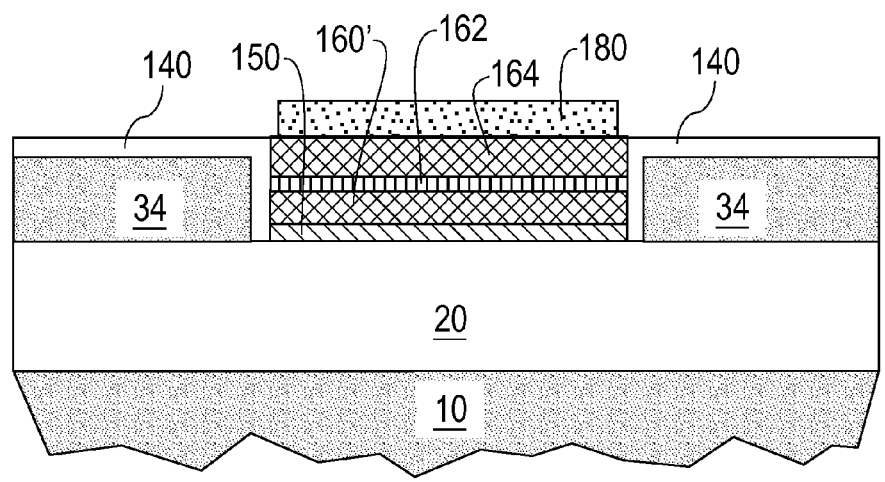
Figure 5C:
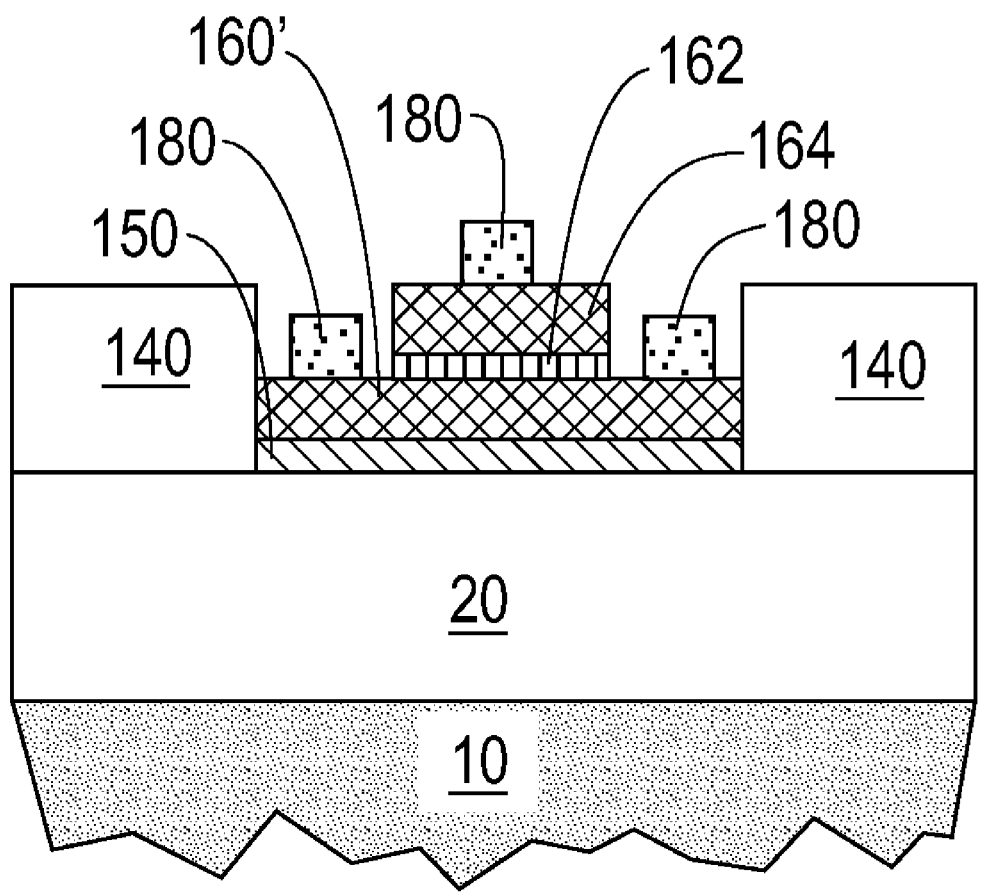

Referring to FIGS. 5A-5C, a fifth exemplary semiconductor structure according to a fifth embodiment of the present invention is shown. FIG. 5A is a top-down view; FIG. 5B is a vertical cross-sectional view along the plane B-B'; and FIG. 5C is a vertical cross-sectional view along the plane C-C'.

The fifth exemplary semiconductor structure comprises a handle substrate 10, a buried insulator layer 20, and at least one single crystalline group IV semiconductor structure 34. The at least one single crystalline group IV semiconductor structure 34 comprises the material of the first region 30 of the first through fourth embodiments, and may be formed by lithographic patterning and etching of the single crystalline group IV semiconductor layer 29, which comprises silicon or germanium and having a first lattice constant and a thickness from about 50 nm to about 6 μm.

The fifth exemplary semiconductor structure further comprises the near-infrared wavelength transparent layer 140 and a single crystalline lattice mismatched group IV semiconductor alloy layer 150 having a second lattice constant as described in the fourth embodiment of the present invention. The single crystalline lattice mismatched group IV semiconductor alloy layer 150 may abut the buried oxide layer as shown in FIGS. 5B and 5C, or alternatively, an intervening thinned second region 30" may be present between the single crystalline lattice mismatched group IV semiconductor alloy layer 150 and the buried insulator layer 20 as shown in FIG. 1F.

The fifth exemplary semiconductor structure further comprises a stack of single crystalline compound semiconductor layers as described above in the fourth embodiment of the present invention. Specifically, the stack comprises:

a first single crystalline compound semiconductor layer 160' abutting the single crystalline lattice mismatched group IV semiconductor alloy layer 150, wherein a top portion of the first single crystalline compound semiconductor layer 160' has a third lattice constant, wherein the second lattice constant is between the first lattice constant and the third lattice constant;

a second single crystalline compound semiconductor layer 162 abutting and epitaxially aligned to the first single crystalline compound semiconductor layer 160'; and a third single crystalline compound semiconductor layer 164 abutting and epitaxially aligned to the second single crystalline compound semiconductor layer 162.

As in the fourth embodiment, layer 162 can be formed of a stack of multiple, alternating thin layers of two single crystalline compound semiconductors of different compositions as to form multiple quantum wells (MQW), which are well known by people skilled in the art.

The at least one single crystalline group IV semiconductor structure 34 may comprise a wave guide. This waveguide may have an increasing cross-sectional area with distance from the stack up to a first distance d1, wherein the distance is the magnitude of the shortest vector of all vectors connecting a given point within the wave guide and any of the points within the stack, and the cross-sectional area is measured in the plane perpendicular to the shortest vector.

The at least one single crystalline group IV semiconductor structure 34 may further comprise multiple wave guides. For example, another wave guide having an increasing cross-sectional area with distance from the stack up to a second distance d2, wherein the distance is the magnitude of the shortest vector of all vectors connecting a given point within the another wave guide and any of the points within the stack, and the cross-sectional area is measured in the plane perpendicular to the shortest vector.

The various single crystalline compound semiconductor layers (160', 162, 164) within the stack may be patterned so that the first single crystalline compound semiconductor layer 160' and the third single crystalline compound semiconductor layer 164 have different areas and metal contacts 180 may be formed on at least two of the various single crystalline compound semiconductor layers (160', 162, 164). Specifically, by reducing the area of the second and third single crystalline compound semiconductor layers (162, 164) relative to the first single crystalline compound semiconductor layer 160', contact 180 may be formed to the first and third single crystalline compound semiconductor layers (160', 164). Optional contact to the second single crystalline compound semiconductor layer 162 is explicitly contemplated herein.

Preferably, the second single crystalline compound semiconductor layer 162 comprises a material having a direct band gap and is capable of amplifying or emitting a laser light. Exemplary materials having a direct band gap and is capable of amplifying or emitting a laser light include GaAs and derived compound semiconductor materials therefrom by partial substitution of Ga or As by other elements. For a specific example, the first single crystalline compound semiconductor layer 160' and the third single crystalline compound semiconductor layer 164 may comprise $GaAs_{1-x}P_x$ and the second single crystalline compound semiconductor layer 162 may comprise $GaAs_{1-y}N_y$, wherein x is in the range from about 0.001 to about 0.999 and y is in the range from about 0.001 to about 0.10.

Preferably, the first single crystalline compound semiconductor layer 160' has a length from about 1 µm to about 1 cm and a width from about 200 nm to about 20 µm, wherein the length is greater than the width.

Preferably, the second single crystalline compound semiconductor layer 162 has a thickness from about 1 nm to about 100 nm and the first and third single crystalline compound semiconductor layers (160', 164) have a thickness from about 50 nm to about 3 µm.

The range of the vertical height of the second single crystalline compound semiconductor layer 162 may be within the range of the vertical height of the wave guide. In other words, the top surface of the at least one single crystalline group IV semiconductor structure 34 is located above the top surface of the second single crystalline compound semiconductor layer 162 and the bottom surface of the at least one single crystalline group TV semiconductor structure 34 is located below the bottom surface of the second single crystalline compound semiconductor layer 162. Such geometric arrangement increases efficiency of light collection by the at least one single crystalline group IV semiconductor structure 34, which are at least one wave guide.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a handle substrate;
    a buried insulator layer located on an upper surface of said handle substrate;
    a single crystalline group IV semiconductor structure having a first lattice constant and comprising a material selected from silicon, germanium, carbon and an alloy thereof located directly on at least one portion of an upper surface of the buried insulator layer;
    a near-infrared transparent layer in direct contact with an upper surface of said single crystalline group IV semiconductor structure;
    a single crystalline lattice mismatched group IV semiconductor alloy layer containing a top portion having a second lattice constant located directly on another portion of the upper surface of the buried insulator layer, wherein said second lattice constant is different from said first lattice constant, and wherein the buried insulator layer electrically isolates an entire lower surface of the single crystalline mismatched group IV semiconductor alloy layer from the handle substrate; and
    a stack of single crystalline compound semiconductor layers, said stack comprising, from bottom to top:
        a first single crystalline compound semiconductor layer having a third lattice constant located on an upper surface of said single crystalline lattice mismatched group IV semiconductor alloy layer, wherein said second lattice constant is between said first lattice constant and said third lattice constant;
        a second single crystalline compound semiconductor layer epitaxially aligned to and located on an upper surface of said first single crystalline compound semiconductor layer, wherein the second single crystalline compound semiconductor layer is composed of a material having a different composition than the first single crystalline compound semiconductor layer, and wherein the composition of the second single crystalline compound semiconductor layer amplifies light or emits a laser beam; and
        a third single crystalline compound semiconductor layer epitaxially aligned to and located on an upper surface of said second single crystalline compound semiconductor layer, wherein the upper surface of said near-infrared transparent layer and an upper surface of said third crystalline compound semiconductor layer are coplanar.

2. The semiconductor structure of claim 1, wherein said single crystalline group IV semiconductor structure comprises a wave guide.

3. The semiconductor structure of claim 2, wherein said waveguide has an increasing cross-sectional area with distance from said stack up to a first distance, wherein said distance is the magnitude of the shortest vector of all vectors connecting a given point within said wave guide and any of the points within said stack, and said cross-sectional area is measured in the plane perpendicular to said shortest vector.

4. The semiconductor structure of claim 2, wherein said second single crystalline compound semiconductor layer comprises a material having a direct band gap.

5. The semiconductor structure of claim 4, wherein said first single crystalline compound semiconductor layer and said third single crystalline compound semiconductor layer comprise $GaAs_{1-x}P_x$ and said second single crystalline compound semiconductor layer comprises $GaAs_{1-y}N_y$, wherein x is in the range from about 0.001 to about 0.999 and y is in the range from about 0.001 to about 0.10.

6. The semiconductor structure of claim 5, wherein said first single crystalline compound semiconductor layer has a length from about 1 μm to about 1 cm and a width from about 200 nm to about 20 μm, wherein said length is greater than said width.

7. The semiconductor structure of claim 5, wherein the range of the vertical height of said second single crystalline compound semiconductor layer is within the range of the vertical height of said wave guide.

\* \* \* \* \*